United States Patent [19]
van den Heuvel et al.

[11] Patent Number: 5,559,807
[45] Date of Patent: Sep. 24, 1996

[54] POWER AMPLIFIER LINEARIZATION IN A TDMA MOBILE RADIO SYSTEM

[75] Inventors: Anthony P. van den Heuvel, Windlesham; Stephen T. Valentine; Dragan Boscovich, both of Basingstoke, all of United Kingdom

[73] Assignee: Motorola, Inc., Schaumburg, Ill.

[21] Appl. No.: 256,299

[22] PCT Filed: Oct. 7, 1993

[86] PCT No.: PCT/EP93/02743

§ 371 Date: Nov. 17, 1994

§ 102(e) Date: Nov. 17, 1994

[87] PCT Pub. No.: WO94/10765

PCT Pub. Date: May 11, 1994

[30] Foreign Application Priority Data

Nov. 2, 1992 [GB] United Kingdom ............... 922292

[51] Int. Cl.$^6$ ..................................................... H04J 3/16
[52] U.S. Cl. ........................................... 370/95.3; 375/297
[58] Field of Search .................... 370/95.1, 95.2, 370/95.3, 77, 29, 58.1, 8, 9, 10, 11, 12, 13, 17, 100.1, 105.1, 50, 70; 330/107, 129, 2, 75, 107, 149; 332/127, 103, 144; 455/42, 69, 116, 216; 375/318, 319, 332, 329, 297, 296, 298, 308, 315

[56] References Cited

U.S. PATENT DOCUMENTS 5,066,923  11/1991  Gailus et al. .................... 330/107
5,440,544  8/1995  Zinser Jr. ...................... 370/95.3

*Primary Examiner*—Douglas W. Olms
*Assistant Examiner*—Dang Ton
*Attorney, Agent, or Firm*—Susan L. Lukasik

[57] ABSTRACT

This invention relates to a time division multiple access (TDMA) trunked radio system and it relates to a frame structure for communication between fixed, mobile and portable radios in such a system. The radio system comprises: a base station and a plurality of remote radio units for communicating over time slots of a time divided radio channel, the base station having means for transmitting a synchronization signal for defining the timing of the time slots, and each of the remote units having a power amplifier with linearization means, characterized in that the channel comprises predetermined linearization time slots (120, FIG. 2) for transmission of training signals, interspersed between other time slots and each remote radio unit comprises means for generating a training signal during a linearization time slot and linearizing its power amplifier during that time slot in advance of and independent of transmission of signals during one of said other time slots.

30 Claims, 2 Drawing Sheets

5,559,807

POWER AMPLIFIER LINEARIZATION IN A TDMA MOBILE RADIO SYSTEM

FIELD OF THE INVENTION

This invention relates to a time division multiple access (TDMA) trunked radio system and it relates to a frame structure for communication between fixed, mobile and portable radios in such a system.

BACKGROUND OF THE INVENTION currently proposed spectrally efficient radio systems such as the proposed European standard for digital trunked radios require highly linear power amplifiers to minimize the transmission of modulation products or "splatter" on adjacent channels. A technique for achieving the necessary linearity performance in power amplifiers involves the use of a linearization training sequence such as is described in U.S. Pat. No. 5066923 of Motorola Inc.

A problem with this method of linearizing of power amplifiers is that a finite amount of time needs to be allocated for the training sequence to be transmitted. In time division multiple access systems, the allocating of a finite amount of air time for training is a particularly costly overhead which reduces overall system throughput.

One method for avoiding the need to allocate excessive air time for training is described in UK patent application No. 9204496.5 of Motorola Limited. In the arrangement described in that patent application, training is achieved off-air by use of a circulator and an antenna switch and a load, in which the training sequence is transmitted into the load by selective operation of the antenna switch.

There is a perceived need in the art for a manner of achieving linearization of the power amplifier without the use of substantial additional hardware and with a minimum of air time being allocated for training. Other requirements that need to be addressed are a minimum delay between a requirement to transmit and the achievement of linearity prior to transmission and/or the minimisation of transmissions while not fully linearized to an acceptably low percentage of all transmissions.

SUMMARY OF THE INVENTION

According to the present invention, a radio system is provided comprising a base station and a plurality of remote radio units for communicating over time slots of a time divided radio channel, the base station having means for transmitting a synchronization signal for defining the timing of the time slots, and each of the remote units having a power amplifier with linearization means, characterized in that the channel comprises predetermined linearization time slots for transmission of linearization training signals, interspersed between other time slots and each remote radio unit comprises means for generating a linearization training signal during a linearization time slot and linearizing its power amplifier during that time slot in advance of and independent of transmission of signals during one of said other time slots.

Throughout this description the word "channel" is used to refer to a physical radio channel, i.e. a given bandwidth of radio spectrum. The expression "logical channel" is used to refer to a predetermined series of timeslots on a physical channel which together form a communication link.

The predetermined linearization timeslots can be considered to be a logical channel and the term "common linearization channel" or "CLCH" will be used to refer to this logical channel.

The invention has the advantage that all users on the system turn to the common linearization channel to train the linear transmitters. It is of no consequence if high power training signals are transmitted on this CLCH, because all units on the system are synchronized to use this CLCH for no other purpose.

Thus, transmitter linear training overhead is not required in every timeslot (traffic or control signalling).

It is preferred that a CLCH is provided on every physical channel.

A problem remains where a unit that wishes to transmit is granted a new physical channel. Unless the CLCH timeslots are provided on a very frequent basis (which would result in a high overhead signalling cost and would be contrary to the aims of the invention), there will be a delay between receiving a command to tune to the new channel and the next CLCH time slot. There is a need to allow such a unit to train its power amplifier without delay, so that it can transmit without delay and without undue splatter onto adjacent channels.

In accordance with a preferred feature of the invention, each of the remote units comprises means for receiving a command on a first channel allowing the unit to transmit on a second channel and means for generating a training signal at the start of transmission on the first selected timeslot on the second channel and no training signal upon transmission on at least predetermined subsequent timeslots on that channel.

Thus, for example, when a base station commands a remote unit or a group of remote units to move to a given physical channel where that physical channel comprises only logical traffic channels, a portion of the first relevant timeslot following the command to go to that channel is dedicated to linearization and the unit that is to transmit (e.g. the unit that requested the channel) generates a linearization training signal during the first portion of the first timeslot.

Preferably all units that receive a command on a first channel causing them to tune to a second channel, for receiving signals on the second channel, automatically generate training signals on the next available linearization time slot on the second channel and linearize their power amplifiers during that time slot. In this manner, all members of a group, including any dispatcher connected to the base station via a landline, are ready to transmit on the new channel.

This arrangement has the advantage of allowing units to train on the new frequency at the first available CLCH on that frequency without setting aside excessive time for linearization in case they should need to respond to the initiator's transmission.

Whereas the unit that has requested a channel and has been instructed to move to the new channel immediately generates a linearization training sequence at a time that is not set aside for linearization across the system and that unit is liable to splatter over to adjacent channels at that time. The arrangement nevertheless reduces the power and occurrence of such unsynchronized training to a minimum.

It is a further preferred feature that all linearisation transmissions shall be at a power level not substantially higher than that to be subsequently used to transmit speech or data on a traffic slot, assuming that the system employs some form of power control to limit splatter generally. This ensures that where incidental splatter does occur, it is as low as possible, and may also mean that under very low power setting conditions, no linearization training may be necessary.

The technique of off air training described in UK patent application No. 9204496.5 may be used during training to still further limit the magnitude of the splatter.

A further preferred feature comprises means associated with the base station for adjusting the timing of transmission of synchronization signals with respect to synchronization signals transmitted by other base stations, e.g. from unrelated systems operating on adjacent frequencies, so as to provide coincidence between linearization time slots between coexisting systems.

A preferred embodiment of the invention will now be described, by way of example only, with reference to the drawings.

DETAILED DESCRIPTION OF THE INVENTION

Figure 1:
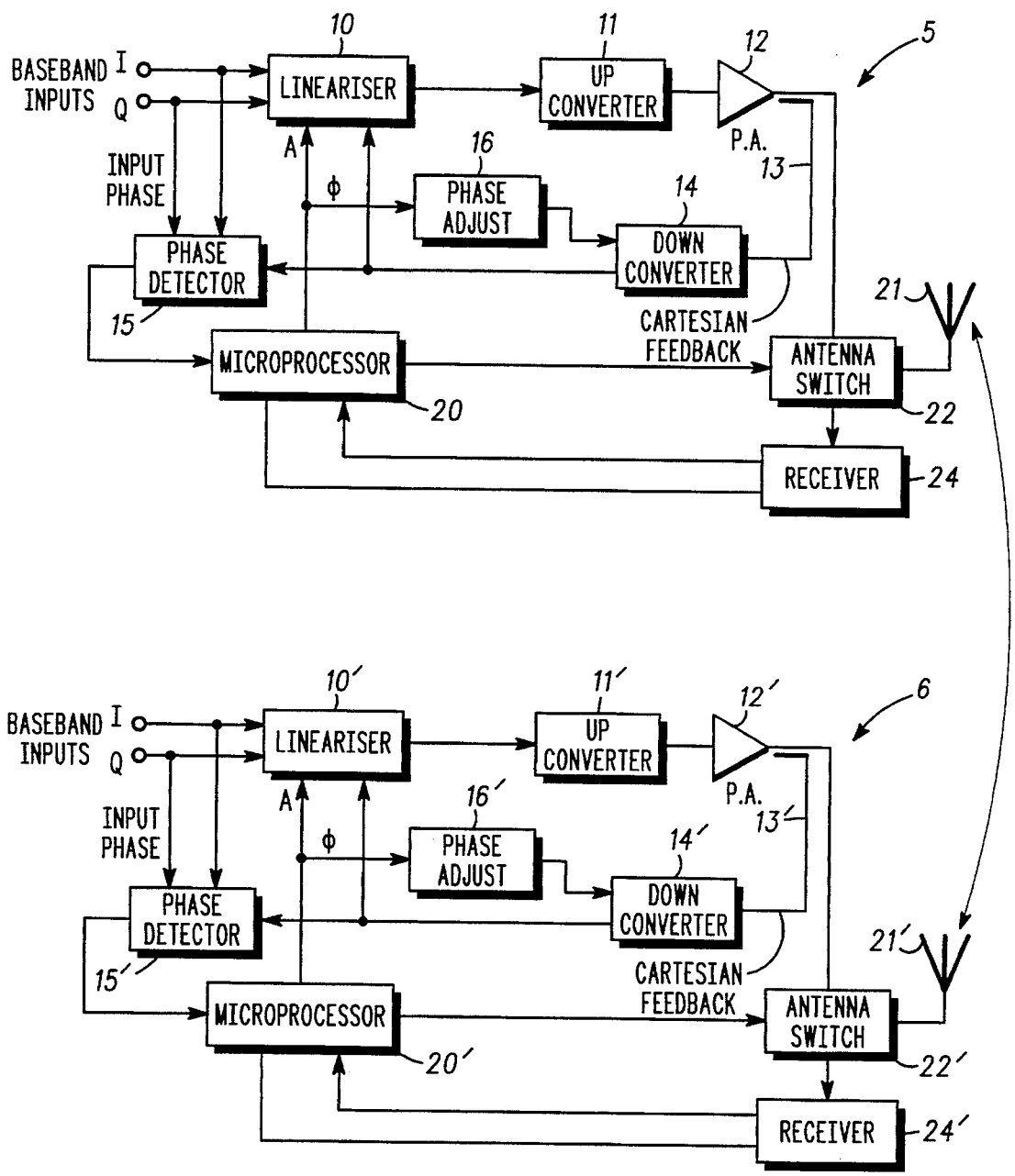
FIG. 1 is a block diagram of a remote radio unit and a base station in accordance with the invention.

FIG. 1 illustrates a remote unit 5 and a base station 6 in accordance with the invention. The remote unit 5 comprises a linearizer 10, an up-converter 11, a power amplifier 12, a feedback loop 13, a down-converter 14, a phase detector 15 and a phase adjuster 16. The linearizer and phase adjuster are under the control of a microprocessor 20. The unit also comprises an antenna 21 connected to an antenna switch (or in appropriate circumstances a duplexer) and a receiver 24.

The general operation of the remote unit is as follows. The antenna switch 22 selectively connects the antenna 21 to the transmitter power amplifier 12 or the receiver 24. When in transmit mode, the power amplifier 12 is connected to the antenna 21 and quadrature baseband inputs are input to the linearizer 10 and simultaneously detected by the phase detector 15. After up conversion and amplification, a portion of the amplified signal is fed by feedback loop 13 to down-converter 14. In response to the phase detected by phase detector 15, the microprocessor 20 controls the phase adjuster 16 and the linearizer 10 to adjust the phase and amplitude respectively of the loop formed by elements 10 to 14.

In order to achieve optimum performance, in is necessary to operate the feedback loop at the point of optimum loop phase for stable operation and maximum gain without clipping for maximum efficiency. In order to find these optimum parameters, a training sequence is input to the linearizer 10. The training sequence preferably has a waveform as described in UK patent application No. 9204496.5 and also described in U.S. Pat. No. 5066923. The exact time of transmission of this sequence is controlled by microprocessor 20.

The elements 10–24 of the remote unit 5 are replicated as elements 10'–24' in the base station 6. In the case of the base station 6, the microprocessor 20' controls the synchronisation and periodically inputs synchronisation sequences into the linearizer 10' to which remote unit 5 will synchronise.

In the case of a remote unit (for example a portable or mobile radio) the microprocessor 20 will cause the switch 22 to switch to receive as a default mode in which the receiver 24 will receive synchronisation sequences from a base station and timing will be deduced from these synchronisation sequences.

Figure 2:
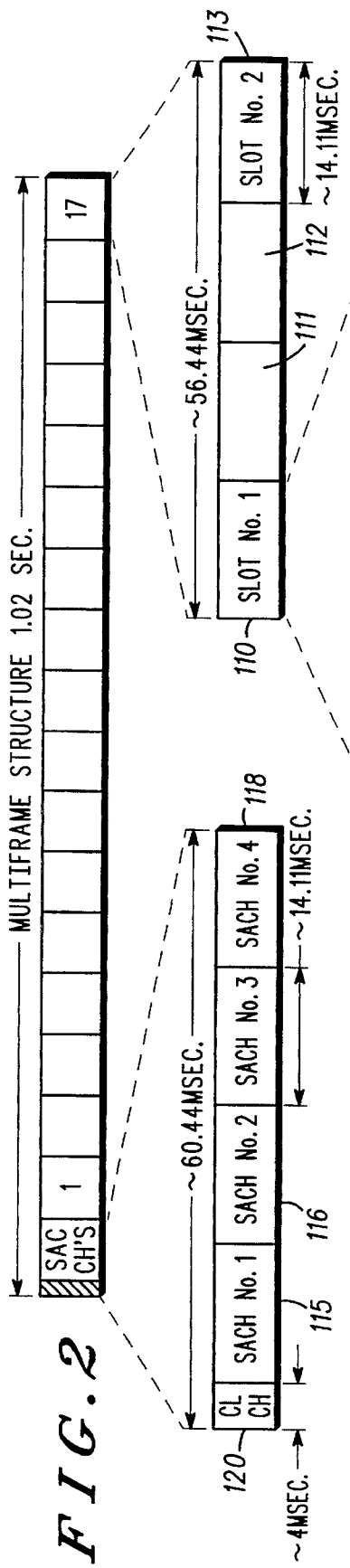
FIG. 2 is a time diagram of the multiframe structure of a control and traffic channel in accordance with the invention.

Referring to FIG. 2, a preferred multiframe structure is illustrated. The multifree structure comprises 18 frames in total, each of which is divided into slots. The first frame is labelled SACCH's (slow associated control channels). Each of the other 17 frames comprise four slots 110 to 113, as shown at the right of the figure. Three of the slots 110 to 113 comprise 508 bits each as shown at the bottom of FIG. 2 labelled "normal traffic channel". The fourth is divided into two subslots and shown in FIG. 3.

Figure 3:
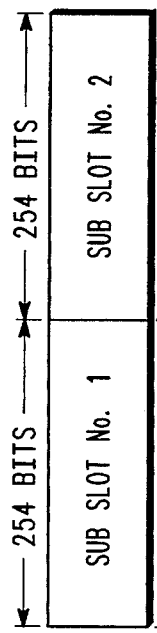
FIG. 3 is a time diagram of a control channel subslot.

FIG. 3 shows the structure of a control channel slot, which is be one of subslots 111 to 113. The control channel subslot has the same length as one traffic slot. Within a control channel slot there are two random access control channel subslots, each being shown at the bottom of FIG. 3.

As shown at the left of FIG. 2, the SACCH's are provided over four slots 115 to 118. A four millisecond transmitter training time 120 is provided at the start of the SACCH frame prior to the first SACCH slot. This 4 millisecond slot is the common linearization channel provided in accordance with the invention.

Other physical channels are divided into multiframes as shown in FIG. 2, with SACCH frames and CLCH timeslots, but these other channels comprise traffic slots as shown in FIG. 2 in place of control slots of the type shown in FIG. 3.

The benefit of having a CLCH is that transmitter linear training overhead is removed from all timeslots. The 4 millisecond transmit training time now appears only once per multiframe (approximately once per second). All timeslots now require only ramp up/down tail and synchronisation overheads, with the exception of the first transmission on a traffic channel (described below).

The operation using the CLCH is as follows. When a radio is powered up by a user, the first operation is to register on the system. Prior to making any transmissions, the radio unit first synchronises on the base transmissions and records system parameters e.g. channel frequencies, including CLCH details. The radio then waits until the system CLCH appears and trains its linear transmitter during the 4 millisecond CLCH period. At this point the radio is now ready to communicate.

Figure 4:
FIG. 4 is a time diagram of the first slot of a logical traffic channel.

The first transmission on a traffic channel on another frequency is shown in FIG. 4. In this case, a 4 millisecond training time is provided (130) to accommodate for any retraining required due to a channel frequency change. Without this training time, a unit that requests a traffic channel and is granted a traffic channel on another frequency would have to wait until the next CLCH timeslot on that frequency before being able to train and transmit. This could introduce a delay of 1 second or more in transmission, which is an undesirable delay.

The transmitter has means for monitoring the critical parameters affecting its linear performance such as battery voltage, temperature, VSWR, transmit power etc. These means are described in U.S. patent application Ser. No. 9204497.3. Once linear, the transmitter only has to relinearize when operation conditions have changed to such an extent that they affect critical parameter values significantly. This is a relatively slow process and generally no significant change occurs over average periods of 20–30 seconds. Therefore, the requirement for a transmitter to retrain is typically in the order of once per minute and thus the impact of implementing CLCH operation on battery life is minimal.

For example a radio transmitter in idle mode will monitor its critical parameters as appropriate and if significant changes in operating conditions have occurred, the radio retrains during the next CLCH. A transmitter in active mode makes its own decision to retrain at the next CLCH during a call without any pressing of the PTT (push-to-talk) or any receipt of a command from the base station and without break in transmission.

If a unit is to transmit at substantially below full power (as determined by the signal strength of the outbound signalling), it can decide to forgo training altogether.

In order to avoid interference with adjacent systems, a mechanism is provided by which the microprocessor 20 of the base station detects regular interference indicative of an adjacent system having regular CLCH timeslots and in response to this detection, the microprocessor 20 adjusts its master clock timing forwards or backwards so as to reduce the shorter interval between its CLCH slots and the adjacent system CHLC slots, until these slots are coincident. Ultimately all systems across a continuous geographic area will synchronize to each other.

In summary, the invention allows the transmitter to be always available for operation, once registered on the system, minimising call set up times. In addition, the removal of access overheads from both slot and subslot increases signalling capacity significantly. Typically a gross signalling capacity of greater than 44 bits per subslot on the RACH can be achieved with prior art methods (i.e. subslot duration of 7 milliseconds with 4 milliseconds of linear training). With the CLCH approach an RACH can now support signalling of 162 bits (gross).

We claim:

1. A radio system for communicating over time slots of a time divided radio channel comprising:

a base station (6) and a plurality of remote radio units (5);

the base station having means (20', 12') for transmitting a synchronization signal for defining the timing of the time slots; and each of the remote radio units having a power amplifier (12) with linearization means (10, 13, 15, 16) for linearizing the power amplifier;

characterized in that the time divided radio channel comprises predetermined linearization time slots (120) for transmission of training signals, interspersed between other time slots; and each remote radio unit comprises means (20) for generating a training signal during a linearization time slot and linearizing its power amplifier (12) during that time slot in advance of and independent of transmission of signals during one of said other time slots.

2. A system according to claim 1, for communicating over a plurality of time divided channels of different frequencies, wherein each channel comprises predetermined linearization time slots for transmission of training signals, interspersed between said other time slots (110–113).

3. A system according to claim 2, wherein each of the remote units comprises means for receiving a command on a first channel allowing the unit to transmit on a second channel and means for generating a training signal and linearizing its power amplifier (12) at the start of transmission on a first selected timeslot on the second channel and no training signal upon transmission on at least predetermined subsequent timeslots on that channel.

4. A system according to claim 2, wherein each of the remote units comprises means for receiving a command on a first channel causing it to tune to a second channel for receiving signals on the second channel, and means for disregarding a first portion of a first selected timeslot on the second channel.

5. A system according to claim 2, wherein each of the remote units comprises means for receiving a command on a first channel causing it to tune to a second channel, for receiving signals on the second channel, and means for automatically generating a training signal on a next available linearization time slot on the second channel and linearizing its power amplifier during that time slot.

6. A system according to claim 5, further comprising means associated with the base station for adjusting the timing of transmission of synchronization signals with respect to synchronization signals transmitted by other base stations.

7. A radio unit for operation in a radio system having a time divided radio channel, the radio unit comprising:

a receiver (24) for receiving synchronization signals for synchronizing to the channel; and a transmitter having a power amplifier (12) with linearization means (10, 13, 15, 16) for linearizing the power amplifier means (20) for generating a linearization training signal, means for inputting a command to transmit other signals and means for transmitting those other signals on input of such a command, characterized in that the channel comprises predetermined linearization time slots (120) for transmission of training signals, interspersed between other time slots for transmission of said other signals; and the radio unit (5) comprises means (20) for generating a training signal during a linearization time slot and linearizing the power amplifier during that time slot, independent of inputting of an instruction to transmit said other signals.

8. A radio unit according to claim 7, comprising means (24) for receiving a command on a first channel allowing the unit to transmit on a second channel and means (20) for generating a training signal and linearizing its power amplifier at the start of transmission on a first selected timeslot on the second channel and no training signal upon transmission on at least predetermined subsequent timeslots on that channel.

9. A radio unit according to claim 7, comprising means (24, 20) for receiving a command on a first channel causing it to tune to a second channel, for receiving signals on the second channel, and means (20) for disregarding a first portion of a first selected timeslot on the second channel.

10. A radio unit according to claim 7, comprising means (24) for receiving a command on a first channel causing it to tune to a second channel, for receiving signals on the second channel, and means for automatically generating a training signal on a next available linearization time slot on the second channel and linearizing its power amplifier during that time slot.

11. A radio unit according to claim 7, comprising operating condition monitoring means for monitoring the operating conditions of the unit and means for again generating a training signal during a linearization time slot and linearizing the power amplifier during that time slot in response only to said operating condition monitoring means.

12. A radio unit according to claim 7, further comprising switchable isolation means for selectively reducing radio frequency transmission during generation of the linearization training signal.

13. A radio unit according to claim 7, further comprising a receiver (24) arranged and constructed
to receive signals on said radio channel during selected traffic time slots and to disregard signals on said radio channel during predetermined training time slots.

14. A system according to claim 3, wherein each of the remote units comprises means for receiving a command on a first channel causing it to tune to a second channel for receiving signals on the second channel, and means for disregarding a first portion of a first selected timeslot on the second channel.

15. A system according to claim 3, wherein each of the remote units comprises means for receiving a command on a first channel causing it to tune to a second channel, for receiving signals on the second channel, and means for automatically generating a training signal on a next available linearization time slot on the second channel and linearizing its power amplifier during that time slot.

16. A system according to claim 4, wherein each of the remote units comprises means for receiving a command on a first channel causing it to tune to a second channel, for receiving signals on the second channel, and means for automatically generating a training signal on a next available linearization time slot on the second channel and linearizing its power amplifier during that time slot.

17. A system according to claim 1, further comprising means associated with the base station for adjusting the timing of transmission of synchronization signals with respect to synchronization signals transmitted by other base stations.

18. A system according to claim 2, further comprising means associated with the base station for adjusting the timing of transmission of synchronization signals with respect to synchronization signals transmitted by other base stations.

19. A system according to claim 3, further comprising means associated with the base station for adjusting the timing of transmission of synchronization signals with respect to synchronization signals transmitted by other base stations.

20. A system according to claim 4, further comprising means associated with the base station for adjusting the timing of transmission of synchronization signals with respect to synchronization signals transmitted by other base stations.

21. A radio unit according to claim 8, comprising means (24, 20) for receiving a command on a first channel causing it to tune to a second channel, for receiving signals on the second channel, and means (20) for disregarding a first portion of a first selected timeslot on the second channel.

22. A radio unit according to claim 8, comprising means (24) for receiving a command on a first channel causing it to tune to a second channel, for receiving signals on the second channel, and means for automatically generating a training signal on a next available linearization time slot on the second channel and linearizing its power amplifier during that time slot.

23. A radio unit according to claim 9, comprising means (24) for receiving a command on a first channel causing it to tune to a second channel, for receiving signals on the second channel, and means for automatically generating a training signal on a next available linearization time slot on the second channel and linearizing its power amplifier during that time slot.

24. A radio unit according to claim 8, comprising operating condition monitoring means for monitoring the operating conditions of the unit and means for again generating a training signal during a linearization time slot and linearizing the power amplifier during that time slot in response only to said operating condition monitoring means.

25. A radio unit according to claim 9, comprising operating condition monitoring means for monitoring the operating conditions of the unit and means for again generating a training signal during a linearization time slot and linearizing the power amplifier during that time slot in response only to said operating condition monitoring means.

26. A radio unit according to claim 10, comprising operating condition monitoring means for monitoring the operating conditions of the unit and means for again generating a training signal during a linearization time slot and linearizing the power amplifier during that time slot in response only to said operating condition monitoring means.

27. A radio unit according to claim 8, further comprising switchable isolation means for selectively reducing radio frequency transmission during generation of the linearization training signal.

28. A radio unit according to claim 9, further comprising switchable isolation means for selectively reducing radio frequency transmission during generation of the linearization training signal.

29. A radio unit according to claim 10, further comprising switchable isolation means for selectively reducing radio frequency transmission during generation of the linearization training signal.

30. A radio unit according to claim 11, further comprising switchable isolation means for selectively reducing radio frequency transmission during generation of the linearization training signal.

* * * * *